(12) United States Patent
Hwang et al.

(10) Patent No.: US 12,021,151 B2
(45) Date of Patent: Jun. 25, 2024

(54) VERTICAL CHANNEL THIN FILM TRANSISTOR AND METHOD FOR MANUFACTURING THE SAME

(71) Applicants: ELECTRONICS AND TELECOMMUNICATIONS RESEARCH INSTITUTE, Daejeon (KR); Korea Advanced Institute of Science and Technology, Daejeon (KR)

(72) Inventors: Chi-Sun Hwang, Daejeon (KR); SangHee Park, Daejeon (KR); KwangHeum Lee, Daejeon (KR); Jae-Eun Pi, Sejong-si (KR); SeungHee Lee, Daejeon (KR); Jong-Heon Yang, Daejeon (KR); Ji Hun Choi, Daejeon (KR)

(73) Assignees: ELECTRONICS AND TELECOMMUNICATIONS RESEARCH INSTITUTE, Daejeon (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 332 days.

(21) Appl. No.: 17/523,320

(22) Filed: Nov. 10, 2021

(65) Prior Publication Data
US 2022/0199836 A1 Jun. 23, 2022

(30) Foreign Application Priority Data
Dec. 21, 2020 (KR) .......................... 10-2020-0179795

(51) Int. Cl.
*H01L 29/786* (2006.01)
*H01L 21/768* (2006.01)
(Continued)

(52) U.S. Cl.
CPC .. *H01L 29/78642* (2013.01); *H01L 21/76877* (2013.01); *H01L 21/823418* (2013.01);
(Continued)

(58) Field of Classification Search
CPC ......... H01L 21/76877; H01L 21/76895; H01L 21/823418; H01L 21/823437;
(Continued)

(56) References Cited

U.S. PATENT DOCUMENTS 5,229,310 A 7/1993 Sivan
7,642,124 B2 1/2010 Dimmler et al.
(Continued)

FOREIGN PATENT DOCUMENTS

KR 10-2009-0008407 A 1/2009
KR 10-2015-0043134 A 4/2015

*Primary Examiner* — Cheung Lee
(74) *Attorney, Agent, or Firm* — LRK PATENT LAW FIRM

(57) ABSTRACT

A vertical channel thin film transistor includes substrate, lower source/drain electrode, spacer layer, upper source/drain electrode covering portion of upper surface of the spacer layer, interlayer insulating pattern covering portion of upper surface of the upper source/drain electrode and upper surface of the spacer layer exposed by the upper source/drain electrode, contact hole disposed on the lower source/drain electrode and passing through the interlayer insulating pattern, the upper source/drain electrode, and the spacer layer, active pattern covering inner wall and bottom surface of the contact hole and extending over upper surface of the upper source/drain electrode and upper surface of the interlayer insulating pattern, gate insulating pattern filling portion of the contact hole and extending along upper surface of the active pattern, and gate electrode filling portion of the contact hole and extending along upper surface of the gate insulating pattern.

20 Claims, 11 Drawing Sheets

(51) Int. Cl.
     *H01L 21/8234* (2006.01)
     *H01L 29/40* (2006.01)
     *H01L 29/49* (2006.01)
     *H01L 29/66* (2006.01)

(52) U.S. Cl.
     CPC .... *H01L 21/823437* (2013.01); *H01L 29/401* (2013.01); *H01L 29/4908* (2013.01); *H01L 29/6653* (2013.01); *H01L 29/6675* (2013.01); *H01L 29/66969* (2013.01); *H01L 29/78696* (2013.01); *H01L 29/7869* (2013.01)

(58) Field of Classification Search
     CPC ..... H01L 21/823475; H01L 21/823487; H01L 29/401; H01L 29/41733; H01L 29/6653; H01L 29/66742; H01L 29/6675; H01L 29/66969; H01L 29/786; H01L 29/78642; H01L 29/7869; H01L 29/78696
     See application file for complete search history.

(56) References Cited

U.S. PATENT DOCUMENTS

| | | |
|---|---|---|
| 9,502,442 B2 | 11/2016 | Song et al. |
| 2003/0209739 A1 | 11/2003 | Hisamoto et al. |
| 2013/0119468 A1 | 5/2013 | Lim et al. |
| 2013/0161732 A1 | 6/2013 | Hwang et al. |
| 2018/0315860 A1 | 11/2018 | Lu et al. |
| 2020/0006506 A1 | 1/2020 | Lee et al. |

VERTICAL CHANNEL THIN FILM TRANSISTOR AND METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2020-0179795, filed on Dec. 21, 2020, the entire content of which is hereby incorporated by reference.

BACKGROUND

1. Field of the Invention

The present disclosure herein relates to a vertical channel thin film transistor and a manufacturing method thereof, and more particularly, to a vertical channel thin film transistor having a contact hole structure and a manufacturing method thereof.

2. Description of Related Art

There is an increasing demand for high resolution displays for realizing realistic images. In particular, new technologies that require ultra-high resolution, such as holograms and VR/AR, are emerging. In order to realize this, it is necessary to implement high resolution in a small area, and high technical difficulty is required. Accordingly, the need for microprocessing continues to increase in the display field as well, but there is a limitation in improving the microprocessing and pixel density through the current equipment and materials. Accordingly, attempts have been made to apply an ultra-fine process for semiconductors using a silicon wafer instead of a traditional glass substrate, but a rapid increase in manufacturing cost becomes an obstacle. In particular, research for the development of deposition, exposure equipment, and process technology applied to glass substrates is in progress, but existing equipment and materials used are required to be replaced, so that a considerable cost is required.

In order to solve such a problem, research and commercialization for changing the structure of a thin film transistor constituting a display driving circuit are in progress. A thin film transistor is a device having three terminals, that is, a gate electrode, a drain electrode, and a source electrode. The main function of a thin film transistor is a switching operation. The thin film transistor may turn on or off the channel between the source electrode and the drain electrode according to a voltage applied to the gate electrode. The thin film transistor may be used as a backplane element of a display device. Recently, as display devices with ultra-high resolution have been proposed, high integration of thin film transistors in a backplane device is required. Accordingly, research on vertical channel type transistors is in progress.

SUMMARY

The present disclosure provides a vertical channel thin film transistor having improved switching characteristics and a method for manufacturing the same.

The present disclosure provides a vertical channel thin film transistor with improved electrical characteristics and a method for manufacturing the same.

An embodiment of the inventive concept provides a vertical channel thin film transistor including: a lower source/drain electrode on a substrate; a spacer layer on the lower source/drain electrode; an upper source/drain electrode disposed on the spacer layer and configured to cover a portion of an upper surface of the spacer layer; an interlayer insulating pattern configured to cover a portion of an upper surface of the upper source/drain electrode and an upper surface of the spacer layer exposed by the upper source/drain electrode; a contact hole disposed on the lower source/drain electrode and passing through the interlayer insulating pattern, the upper source/drain electrode, and the spacer layer; an active pattern configured to conformally cover an inner wall and a bottom surface of the contact hole and extend over an upper surface of the upper source/drain electrode and an upper surface of the interlayer insulating pattern; a gate insulating pattern configured to fill a portion of the contact hole and extend along an upper surface of the active pattern; and a gate electrode configured to fill a portion of the contact hole and extend along an upper surface of the gate insulating pattern.

In an embodiment, a lower surface of the upper source/drain electrode may be located at a higher level than the upper surface of the lower source/drain electrode.

In an embodiment, a portion of the upper source/drain electrode may vertically overlap a portion of the lower source/drain electrode.

In an embodiment, the contact hole may expose a portion of an upper surface of the lower source/drain electrode, a side surface of the spacer layer, a side and part of upper surface of the upper source/drain electrode, and a side surface of the interlayer insulating pattern.

In an embodiment, the gate electrode may include: an upper gate electrode on the gate insulating pattern; and a lower gate electrode interposed on the upper gate electrode and the gate insulating pattern.

In an embodiment, the upper gate electrode and the lower gate electrode may include different materials.

In an embodiment, one of the upper gate electrode and the lower gate electrode may be formed by a sputtering process, and the other one of the upper gate electrode and the lower gate electrode may be formed by an atomic layer deposition (ALD) process.

In an embodiment, the vertical channel thin film transistor may further include lower side spacers provided on the substrate and disposed on both sides of the lower source/drain electrode, wherein the lower side spacers may cover both sides of the lower source/drain electrode.

In an embodiment, the vertical channel thin film transistor may further include a protective pattern interposed between the active pattern and the gate insulating pattern.

In an embodiment, a portion of the active pattern may have a "U"-shaped cross section, wherein a portion of the gate electrode may have a "U"-shaped cross-section.

In an embodiment, the upper source/drain electrodes may be vertically spaced apart from the lower source/drain electrodes.

In an embodiment of the inventive concept, a method for manufacturing a vertical channel thin film transistor includes: forming a lower source/drain electrode on a substrate; forming a spacer layer on the lower source/drain electrode; forming an upper source/drain electrode to cover a portion of an upper surface of the spacer layer; forming an interlayer insulating pattern to cover a portion of an upper surface of the upper source/drain electrode and an upper surface of the spacer layer exposed by the upper source/drain electrode; forming a contact hole penetrating the interlayer insulating pattern, the upper source/drain electrode, and the spacer layer; forming an active pattern that conformally covers the inner wall and the bottom surface of the contact hole and extends over the upper surface of the upper source/drain electrode and the upper surface of the interlayer insulating pattern; forming a gate insulating pattern formed on the active pattern and filling a portion of the contact hole; and forming a gate electrode formed on the gate insulating pattern and filling a part of the contact hole.

In an embodiment, the forming of the gate electrode may include: forming a lower gate electrode extending along an upper surface of the gate insulating pattern; and forming an upper gate electrode extending along an upper surface of the lower gate electrode on the lower gate electrode.

In an embodiment, one of the upper gate electrode and the lower gate electrode may be formed by a sputtering process, and the other of the upper gate electrode and the lower gate electrode is formed by an atomic layer deposition (ALD) process.

In an embodiment, the upper gate electrode and the lower gate electrode may include different materials.

In an embodiment, the method may further include: forming a lower side spacer film on the substrate after forming the lower source/drain electrode; and forming a lower side spacer by etching the lower side spacer film, wherein the lower side spacers may be formed to cover both sides of the lower source/drain electrode, wherein the spacer layer may cover the lower side spacers.

In an embodiment, the method may further include: forming an upper side spacer film on the spacer layer after forming the upper source/drain electrodes; and etching the upper side spacer film to form an upper side spacer, wherein the upper side spacer may be formed to cover one side of the upper source/drain electrode.

In an embodiment, the upper side spacer may be removed by forming the contact hole.

In an embodiment, the method may further include forming a protective pattern on the active pattern after forming the active pattern.

In an embodiment, the lower surface of the upper source/drain electrode may be located at a higher level than the upper surface of the lower source/drain electrode, wherein a portion of the upper source/drain electrode may vertically overlap a portion of the lower source/drain electrode.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
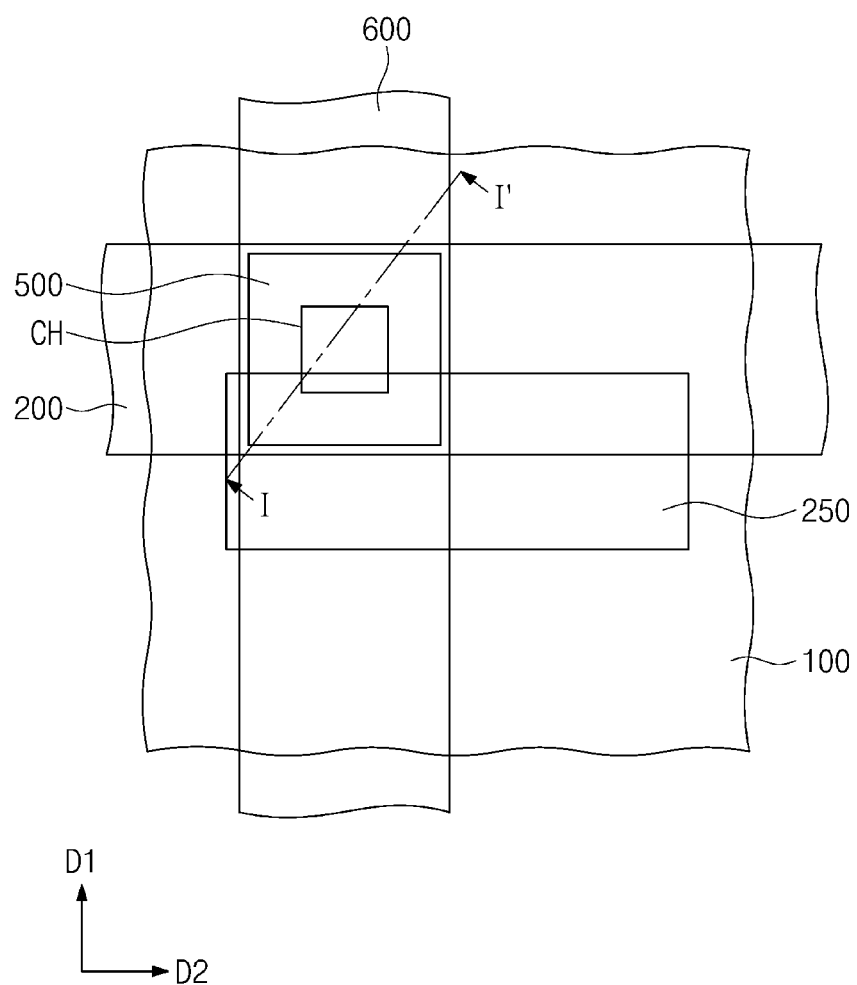
FIG. 1 is a plan view of a vertical channel thin film transistor according to an embodiment of the inventive concept.

Advantages and features of the inventive concept, and a method of achieving them, will become apparent with reference to the embodiments described below in detail in conjunction with the accompanying drawings. However, the inventive concept is not limited to the embodiments disclosed below, but may be implemented in various different forms, and only these embodiments are provided so that the disclosure of the inventive concept is complete, and to fully inform those of ordinary skill in the scope of the invention in the technical field to which the inventive concept belongs, and the invention is only defined by the scope of the claims. Like reference numerals refer to like elements throughout the specification.

The terms used in this specification are for describing embodiments and are not intended to limit the inventive concept. In this specification, the singular form also includes the plural form unless specifically stated in the phrase. As used in the specification, in relation to 'comprises' and/or 'comprising', the mentioned elements, steps, operations and/or elements do not exclude the presence or addition of one or more other elements, steps, operations and/or elements.

Further, the embodiments described herein will be described with reference to cross-sectional and/or plan views, which are ideal illustrative views of the inventive concept. In the drawings, thicknesses of films and regions are exaggerated for effective description of technical content. Accordingly, the shape of the illustrative drawing may be modified due to manufacturing technology and/or tolerance. Accordingly, the embodiments of the inventive concept are not limited to the specific form shown, but also include changes in the form generated according to the manufacturing process. Accordingly, the regions illustrated in the drawings have schematic properties, and the shapes of the regions illustrated in the drawings are intended to illustrate a specific shape of the device region and are not intended to limit the scope of the invention.

In addition, terms used in the present specification may be interpreted as meanings commonly known to those of ordinary skill in the art, unless otherwise defined.

Hereinafter, in order to describe the inventive concept in more detail, embodiments according to the inventive concept will be described in more detail with reference to the accompanying drawings.

Figure 2:
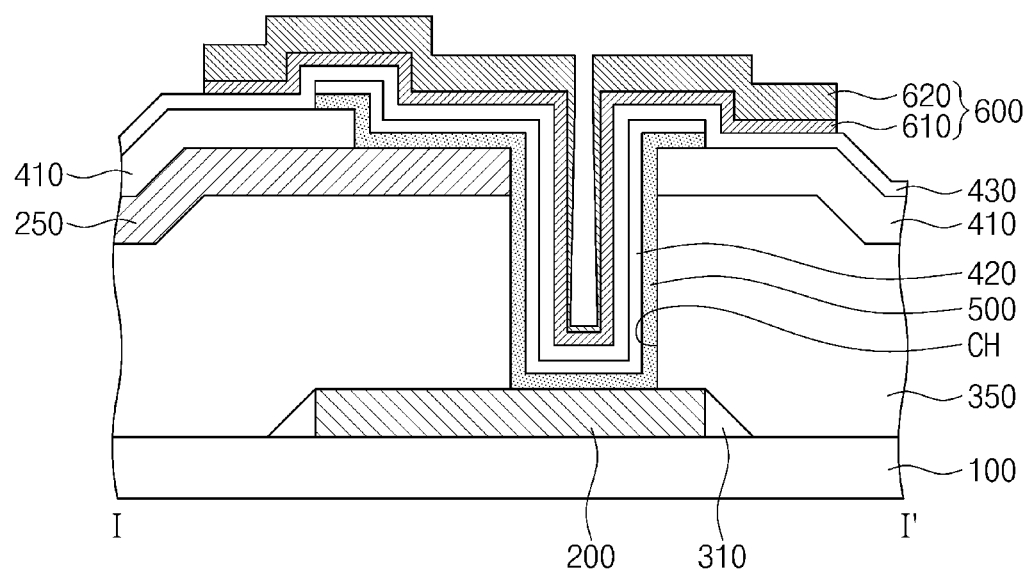
FIG. 2 is a cross-sectional view taken along line I-I' of FIG. 1.

FIG. 1 is a plan view of a vertical channel thin film transistor according to an embodiment of the inventive concept. FIG. 2 is a cross-sectional view taken along line I-I' of FIG. 1.

Referring to FIGS. 1 and 2, a vertical channel thin film transistor (VTFT) according to an embodiment of the inventive concept includes a substrate 100, a lower source/drain electrode 200, an upper source/drain electrode 250, an active pattern 500, a gate electrode 600, and a contact hole CH.

The gate electrode 600 may extend in the first direction D1. The lower source/drain electrode 200 may extend in the second direction D2. The first direction D1 and the second direction D2 may be directions parallel to the upper surface of the substrate 100, and the first direction D1 and the second direction D2 may be perpendicular to each other. The gate electrode 600 and the lower source/drain electrode 200 may be disposed to cross each other. For example, the gate electrode 600 may transmit a gate signal, and the lower source/drain electrode 200 may transmit a data voltage.

The upper source/drain electrode 250 may be disposed adjacent to the lower source/drain electrode 200 and the gate electrode 600. Specifically, the upper source/drain electrode 250 may vertically overlap a portion where the lower source/drain electrode 200 and the gate electrode 600 cross each other.

The active pattern 500 may be disposed adjacent to the lower source/drain electrode 200 and the gate electrode 600. Specifically, the active pattern 500 may vertically overlap a portion where the lower source/drain electrode 200 and the gate electrode 600 cross each other.

The contact hole CH may be disposed adjacent to the lower source/drain electrode 200 and the gate electrode 600. Specifically, the contact hole CH may vertically overlap a portion where the lower source/drain electrode 200 and the gate electrode 600 cross each other.

For simplicity of the drawing, only one gate electrode 600 and one lower source/drain electrode 200 are illustrated in FIG. 1, but the substrate 100 of the VTFT according to the embodiments of the present specification may include a plurality of gate electrodes 600 and a plurality of lower source/drain electrodes 200. More specifically, the lower source/drain electrodes 200 may be disposed to be spaced apart from each other in the first direction D1, and the gate electrodes 600 may be disposed to be spaced apart from each other in the second direction D2.

Hereinafter, a VTFT according to an embodiment of the inventive concept will be described in more detail. A substrate 100 may be provided. The substrate 100 may be an insulating substrate. For example, the substrate 100 may be a glass substrate, a silicon substrate, a sapphire substrate, or a plastic substrate, and the substrate 100 may further include an insulating material. For example, the insulating material may include polyimide or the like.

A lower source/drain electrode 200 may be disposed on the substrate 100. The lower source/drain electrode 200 may cover a portion of the upper surface of the substrate 100. The lower source/drain electrode 200 may include a metal oxide, a metal nitride, or a conductive metal material. For example, the metal oxide may include at least one of indium tin oxide and indium zinc oxide, and the metal nitride may include titanium nitride (TiN) as a conductive metal material, and the conductive metal material may include at least one of molybdenum (Mo), aluminum (Al), titanium (Ti), tungsten (W), tungsten titanium (TiW), and alloys thereof. For example, the lower source/drain electrode 200 may include a stacked structure of molybdenum/tungsten titanium/aluminum/tungsten titanium (Mo/TiW/Al/TiW).

Lower side spacers 310 may be disposed on both sides of the lower source/drain electrodes 200. The lower side spacer 310 may cover both side surfaces of the lower source/drain electrode 200. The lower side spacer 310 may include an insulating material.

A spacer layer 350 may be provided on the substrate 100. The spacer layer 350 may be disposed on the lower source/drain electrode 200 and the lower side spacer 310. The spacer layer 350 may cover upper surfaces of the lower source/drain electrode 200 and the lower side spacer 310. The spacer layer 350 may include an insulating material. For example, the spacer layer 350 may include at least one of silicon oxide ($SiO_2$), silicon nitride (SiNx), aluminum oxide ($Al_2O_3$), and an organic insulating material, and may be formed in a single-layer or stacked structure.

An upper source/drain electrode 250 may be provided on the spacer layer 350. The upper source/drain electrodes 250 may be disposed on the upper surface of the spacer layer 350 to partially cover the upper surface of the spacer layer 350. That is, the upper source/drain electrode 250 may expose one side of the upper surface of the spacer layer 350. The lower source/drain electrode 200 and the upper source/drain electrode 250 may be electrically separated by the spacer layer 350. The lower source/drain electrode 200 and the upper source/drain electrode 250 may not be positioned at the same level. In this specification, a level may mean a height from the upper surface of the substrate 100. Specifically, a lower surface of the upper source/drain electrode 250 may be positioned at a higher level than an upper surface of the lower source/drain electrode 200. That is, the upper source/drain electrodes 250 may be spaced apart from the lower source/drain electrodes 200 in a direction perpendicular to the upper surface of the substrate 100, that is, vertically. The lower source/drain electrode 200 and the upper source/drain electrode 250 may partially overlap vertically.

The upper source/drain electrode 250 may include a metal oxide, a metal nitride, or a conductive metal material. For example, the metal oxide may include at least one of indium tin oxide and indium zinc oxide, and the metal nitride may include titanium nitride (TiN) as a conductive metal material, and the conductive metal material may include at least one of molybdenum (Mo), aluminum (Al), titanium (Ti), tungsten (W), tungsten titanium (TiW), and alloys thereof. For example, the upper source/drain electrode 250 may include a single layer of molybdenum (Mo).

An interlayer insulating pattern 410 may be disposed on a portion of the upper surface of the upper source/drain electrode 250 and on the upper surface of the spacer layer 350 exposed by the upper source/drain electrode 250. The interlayer insulating pattern 410 may cover a portion of the upper surface of the upper source/drain electrode 250 and the upper surface of the spacer layer 350 exposed by the upper source/drain electrode 250. The upper source/drain electrodes 250 may be protected during a subsequent etching process by the interlayer insulating pattern 410. The interlayer insulating pattern 410 may include an insulating material. For example, the interlayer insulating pattern 410 may include at least one of silicon oxide ($SiO_2$), silicon nitride (SiNx), and aluminum oxide ($Al_2O_3$). In some embodiments, unlike illustrated, the VTFT may not include the interlayer insulating pattern 410.

A contact hole CH may be provided on the substrate 100. The contact hole CH is disposed on the lower source/drain electrode 200 to penetrate the interlayer insulating pattern 410, the upper source/drain electrode 250, and the spacer layer 350. The contact hole CH may expose a portion of an upper surface of the lower source/drain electrode 200. The contact hole CH may expose a side surface of the spacer layer 350, a side and a portion of an upper surface of the upper source/drain electrode 250, and a side surface of the interlayer insulating pattern 410.

An active pattern 500 may be provided on the lower source/drain electrode 200. The active pattern 500 may be disposed on the inner surface of the contact hole CH. The active pattern 500 may be formed to conformally cover the inner wall and the bottom surface of the contact hole CH, and may extend to cover a portion of the upper surface of the upper source/drain electrode 250 and the upper surface of the interlayer insulating pattern 410. A portion of the active pattern 500 may extend on the upper surface of the upper source/drain electrode 250, and another portion of the active pattern 500 may extend onto the upper surface of the lower source/drain electrode 200 exposed by the contact hole CH. That is, a portion of the active pattern 500 may have a "U"-shaped cross-section. The active pattern 500 may at least partially overlap the upper source/drain electrode 250 and the lower source/drain electrode 200. Accordingly, during operation of the thin film transistor, the active pattern 500 may form a channel between the upper source/drain electrode 250 and the lower source/drain electrode 200. For example, the active pattern 500 may include amorphous silicon (a-Si), low temperature polysilicon (LTPS), or an oxide semiconductor. For example, the oxide semiconductor may include at least one of indium gallium zinc oxide (IGZO), indium tin zinc oxide (ITZO), indium zinc oxide (IZO), indium oxide (InOx), and zinc tin oxide (ZTO). For example, the active pattern 500 may be a single layer including the oxide semiconductor or a multilayer structure in which different oxide semiconductors are stacked.

A protective pattern 420 may be disposed on the active pattern 500. The protective pattern 420 may be interposed between the active pattern 500 and a gate insulating pattern 430 to be described later. The protective pattern 420 may fill a portion of the contact hole CH and may extend onto the upper surface of the active pattern 500. The protective pattern 420 may protect the active pattern 500 during subsequent etching and ashing processes. The protective pattern 420 may include an insulating material. In some embodiments, the VTFT may not include the guard pattern 420.

A gate insulating pattern 430 may be disposed on the active pattern 500. The gate insulating pattern 430 may fill a portion of the contact hole CH and may extend along the upper surface of the active pattern 500. In more detail, the gate insulating pattern 430 may be disposed on the protective pattern 420. The gate insulating pattern 430 may fill a portion of the contact hole CH and may extend along the upper surface of the protective pattern 420. The protective pattern 420 may extend to cover the active pattern 500 and the upper surface of the interlayer insulating pattern 410 exposed by the protective pattern 420. The gate insulating pattern 430 may include an insulating material. For example, the gate insulating pattern 430 may include at least one of silicon oxide ($SiO_2$), silicon nitride (SiNx), aluminum oxide ($Al_2O_3$), hafnium oxide (HfOx), and zirconium oxide (ZrOx). The gate insulating pattern 430 may be a single layer or a multilayer structure in which insulating materials are stacked on each other.

A gate electrode 600 may be disposed on the gate insulating pattern 430. The gate electrode 600 may fill a portion of the contact hole CH and may extend along the upper surface of the gate insulating pattern 430. That is, a portion of the gate electrode 600 may have a "U"-shaped cross-section. The gate electrode 600 may include an upper gate electrode 620 on the gate insulating pattern 430 and a lower gate electrode 610 interposed between the gate insulating pattern 430 and the upper gate electrode 620. That is, the lower gate electrode 610 may fill a portion of the contact hole CH and may extend along the upper surface of the gate insulating pattern 430. The upper gate electrode 620 may fill a portion of the contact hole CH and may extend along an upper surface of the lower gate electrode 610. That is, a portion of the lower gate electrode 610 may have a "U"-shaped cross-section. A portion of the upper gate electrode 620 may have a "U"-shaped cross-section.

The lower gate electrode 610 and the upper gate electrode 620 may include a metal oxide, a metal nitride, or a conductive metal material. For example, the metal oxide may include at least one of indium tin oxide and indium zinc oxide, and the metal nitride may include titanium nitride (TiN) as a conductive metal material, and the conductive metal material may include at least one of molybdenum (Mo), aluminum (Al), titanium (Ti), tungsten (W), tungsten titanium (TiW), and alloys thereof.

In some embodiments, the lower gate electrode 610 and the upper gate electrode 620 may include different materials (e.g., materials having different resistances). For example, the lower gate electrode 610 may include indium tin oxide or indium zinc oxide, and the upper gate electrode 620 may include molybdenum (Mo). As another example, the lower gate electrode 610 may include molybdenum (Mo), and the upper gate electrode 620 may include indium tin oxide or indium zinc oxide. In another embodiment, the lower gate electrode 610 and the upper gate electrode 620 may include the same material. In this case, the gate electrode 600 may be a single layer.

In some embodiments, although not shown in the drawing, a passivation pattern may be interposed between the active pattern and an inner wall of the contact hole. The passivation pattern may not be interposed between the bottom surface of the contact hole and the active pattern. The passivation pattern may protect the spacer layer 350 during a subsequent etching process, thereby improving the interfacial properties of the spacer layer 350. The passivation pattern may include an insulating material, for example, may include at least one of silicon oxide ($SiO_2$), silicon nitride (SiNx), and aluminum oxide ($Al_2O_3$).

A thickness of the gate electrode 600 on the contact hole CH may be smaller than a thickness of the gate electrode 600 on the upper source/drain electrode 250 and the interlayer insulating pattern 410. For example, when the upper gate electrode 620 includes molybdenum (Mo), a thickness of the upper gate electrode 620 on the contact hole CH may be smaller than a thickness of the upper gate electrode 620 on the upper source/drain electrode 250 and the interlayer insulating pattern 410. As another example, when the lower gate electrode 610 includes molybdenum (Mo), a thickness of the lower gate electrode 610 on the contact hole CH may be smaller than a thickness of the lower gate electrode 610 on the upper source/drain electrode 250 and the interlayer insulating pattern 410.

In general, since the active pattern and the gate electrode are formed along vertical sidewalls in the VTFT, when the active pattern and the gate electrode are formed by dry etching, residues in the form of spacers may remain in unwanted areas. Accordingly, the conventional VTFT may generate a leakage current. On the other hand, according to the inventive concept, since the dry etching process of the active pattern and the gate electrode is performed on a flat area outside the contact hole, the occurrence of leakage current may be prevented. In addition, according to the inventive concept, as the active pattern is formed on the contact hole, the width of the active pattern increases, and accordingly, the switching characteristics and current characteristics of the VTFT may be improved. Furthermore, when the VTFT of the inventive concept is applied to a display, the size of a unit pixel of the display may be reduced, so that an ultra-high resolution display may be realized.

FIGS. 3 to 17 are cross-sectional views for explaining a method of manufacturing a VTFT according to an embodiment of the inventive concept. Hereinafter, content overlapping with the above content may be omitted.

Figure 3:
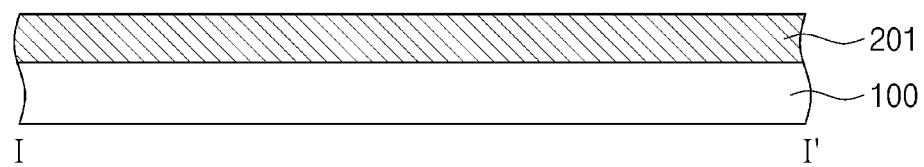
FIGS. 3 to 17 are cross-sectional views for explaining a method of manufacturing a vertical channel thin film transistor according to an embodiment of the inventive concept.

Referring to FIG. 3, a substrate 100 may be provided. A lower source/drain electrode layer 201 may be formed on the substrate 100. The lower source/drain electrode layer 201 may be formed to cover the upper surface of the substrate 100. The lower source/drain electrode layer 201 may include a metal oxide, a metal nitride, or a conductive metal material. For example, the metal oxide may include at least one of indium tin oxide and indium zinc oxide, and the metal nitride may include titanium nitride (TiN) as a conductive metal material, and the conductive metal material may include at least one of molybdenum (Mo), aluminum (Al), titanium (Ti), tungsten (W), tungsten titanium (TiW), and alloys thereof. For example, the lower source/drain electrode layer 201 may include molybdenum/tungsten titanium/aluminum/tungsten titanium (Mo/TiW/Al/TiW) having a stacked structure.

Figure 4:
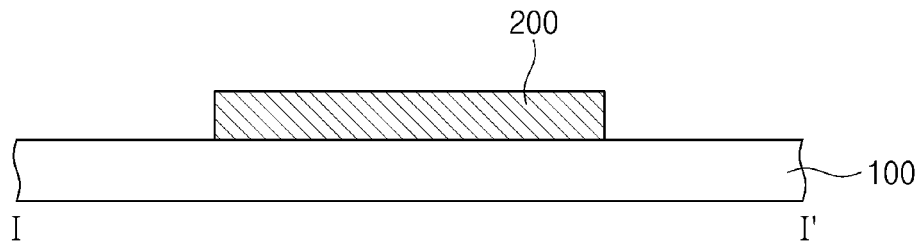

Referring to FIG. 4, a lower source/drain electrode 200 may be formed on the substrate 100. Forming the lower source/drain electrode 200 may include performing a photolithography process and an etching process on the lower source/drain electrode layer 201. Through the etching process, the lower source/drain electrodes 200 may be formed to cover a portion of the upper surface of the substrate 100. For example, the etching process may be a dry etching process.

Figure 5:
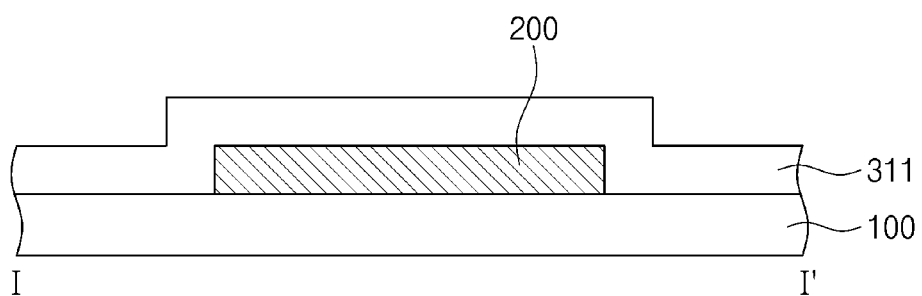

Referring to FIG. 5, a lower side spacer film 311 may be formed on the lower source/drain electrode 200. The lower side spacer film 311 may be formed to conformally cover the upper surface of the lower source/drain electrode 200 and the upper surface of the substrate 100 exposed by the lower source/drain electrode 200. The lower side spacer film 311 may include an insulating material.

Figure 6:
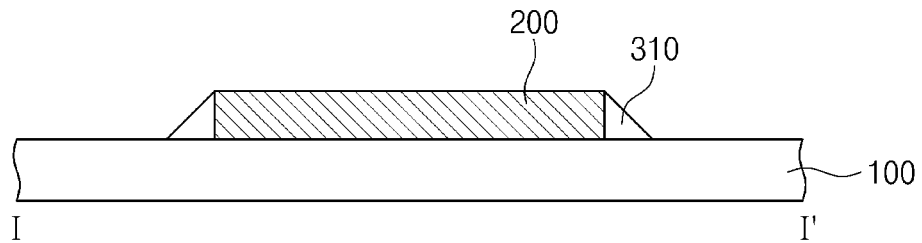

Referring to FIG. 6, a lower side spacer 310 may be formed on the lower source/drain electrode 200. Forming the lower side spacer 310 may include etching the lower side spacer film 311. Through the etching process, the lower side spacers 310 may be formed to cover both sides of the lower source/drain electrodes 200. In addition, the upper surface of the lower source/drain electrode 200 may be exposed by the etching process. For example, the etching process may be a dry etching process.

Figure 7:
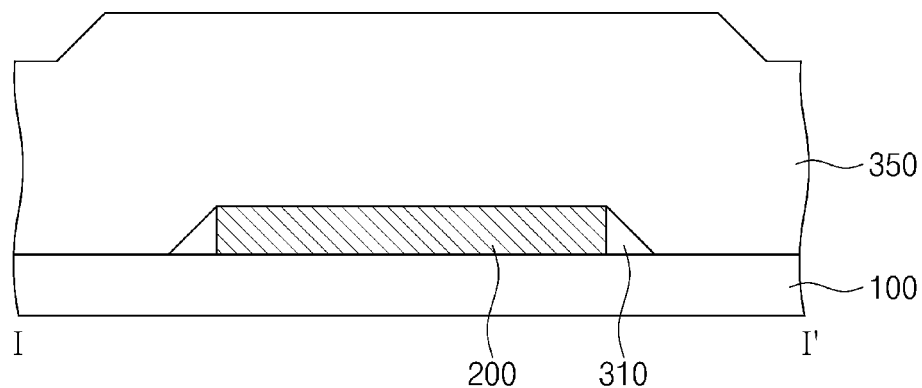

Referring to FIG. 7, a spacer layer 350 may be formed on the lower source/drain electrode 200. Forming the spacer layer 350 may be performed by a plasma-enhanced chemical vapor deposition (PECVD) process, an atomic layer deposition (ALD) process, a solution process, or the like. The process may be selected according to the thickness and physical properties of the spacer layer 350. The spacer layer 350 may cover the upper surface of the lower source/drain electrode 200 and the upper surface of the lower side spacer 310. The spacer layer 350 may cover the upper surface of the substrate 100 exposed by the lower source/drain electrodes 200 and the lower side spacer 310. The spacer layer 350 may include an insulating material. For example, the spacer layer 350 may include at least one of silicon oxide ($SiO_2$), silicon nitride (SiNx), aluminum oxide ($Al_2O_3$), and an organic insulating material, and may be formed in a single-layer or stacked structure.

Figure 8:
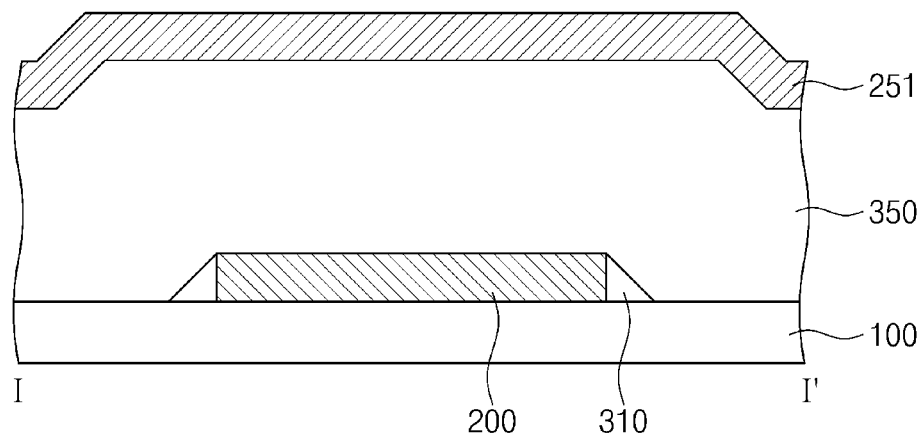

Referring to FIG. 8, an upper source/drain electrode layer 251 may be formed on the spacer layer 350. The upper source/drain electrode layer 251 may be formed to conformally cover an upper surface of the spacer layer 350. The upper source/drain electrode layer 251 may include a metal oxide, a metal nitride, or a conductive metal material. For example, the metal oxide may include at least one of indium tin oxide and indium zinc oxide, and the metal nitride may include titanium nitride (TiN) as a conductive metal material, and the conductive metal material may include at least one of molybdenum (Mo), aluminum (Al), titanium (Ti), tungsten (W), tungsten titanium (TiW), and alloys thereof. For example, the upper source/drain electrode layer 251 may include a single layer of molybdenum (Mo).

Figure 9:
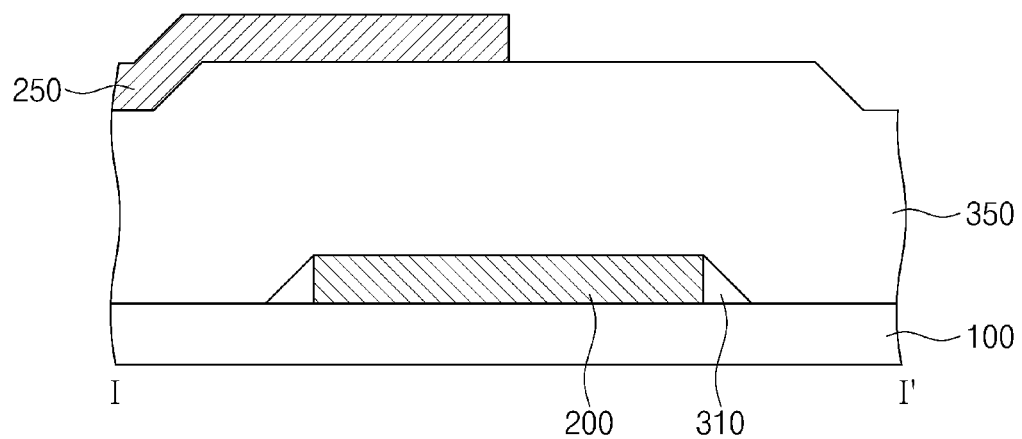

Referring to FIG. 9, an upper source/drain electrode 250 may be formed on the spacer layer 350. Forming the upper source/drain electrode 250 may include performing a photolithography process and an etching process on the upper source/drain electrode layer 251. Through the etching process, the upper source/drain electrodes 250 may be formed to partially cover the upper surface of the spacer layer 350. For example, the etching process may be a dry etching process.

Figure 10:
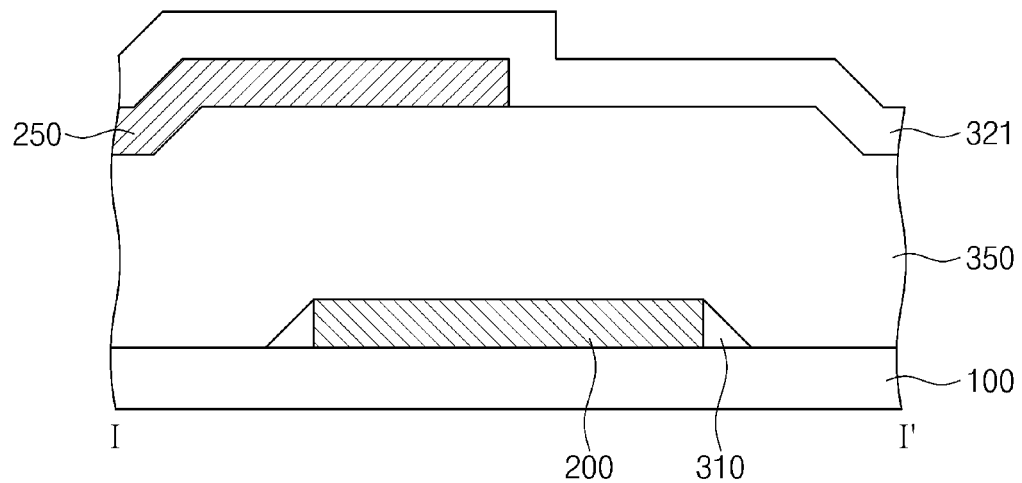

Referring to FIG. 10, an upper side spacer film 321 may be formed on the spacer layer 350. The upper side spacer film 321 may be formed to conformally cover the upper surface of the upper source/drain electrode 250 and the upper surface of the spacer layer 350 exposed by the upper source/drain electrode 250. The upper side spacer film 321 may include an insulating material.

Figure 11:
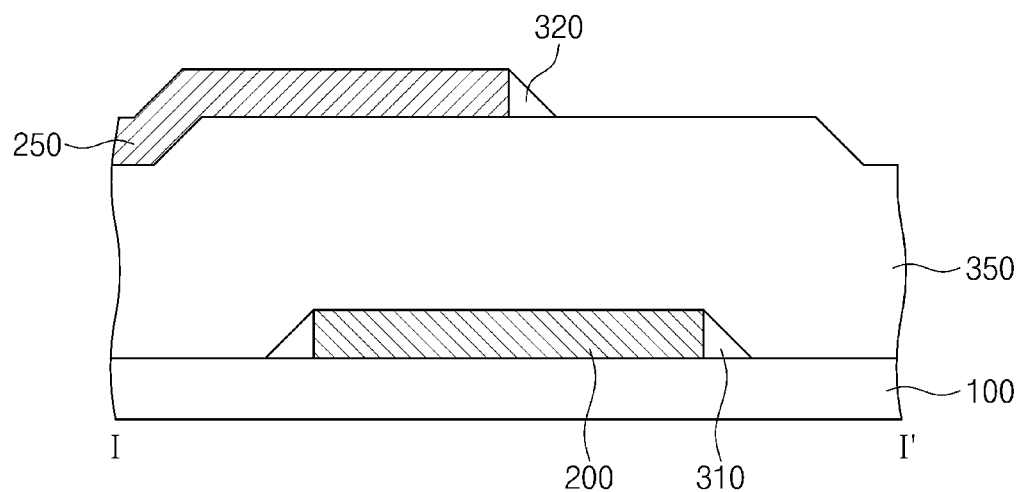

Referring to FIG. 11, an upper side spacer 320 may be formed on the spacer layer 350. Forming the upper side spacer 320 may include etching the upper side spacer film 321. Through the etching process, the upper side spacer 320 may be formed to cover one side of the upper source/drain electrode 250. In addition, the upper surface of the upper source/drain electrode 250 may be exposed by the etching process. For example, the etching process may be a dry etching process.

Figure 12:
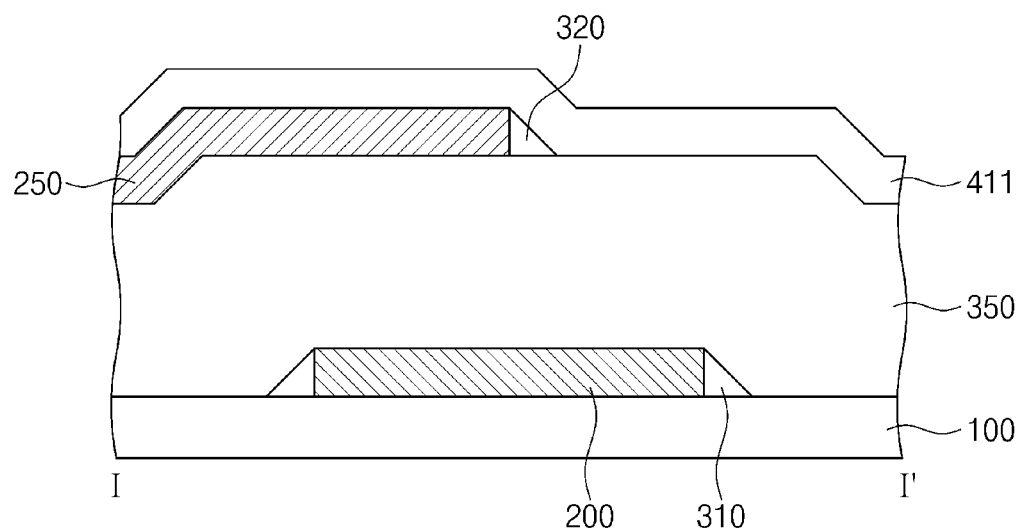

Referring to FIG. 12, an interlayer insulating film 411 may be formed on the spacer layer 350. The interlayer insulating film 411 may be formed to conformally cover the upper surface of the upper source/drain electrode 250 and the upper surface of the upper side spacer 320. The interlayer insulating film 411 may be formed to conformally cover an upper surface of the spacer layer 350 exposed by the upper source/drain electrodes 250 and the upper side spacer 320. The interlayer insulating film 411 may include an insulating material. For example, the interlayer insulating film 411 may include at least one of silicon oxide ($SiO_2$), silicon nitride (SiNx), and aluminum oxide ($Al_2O_3$).

Figure 13:
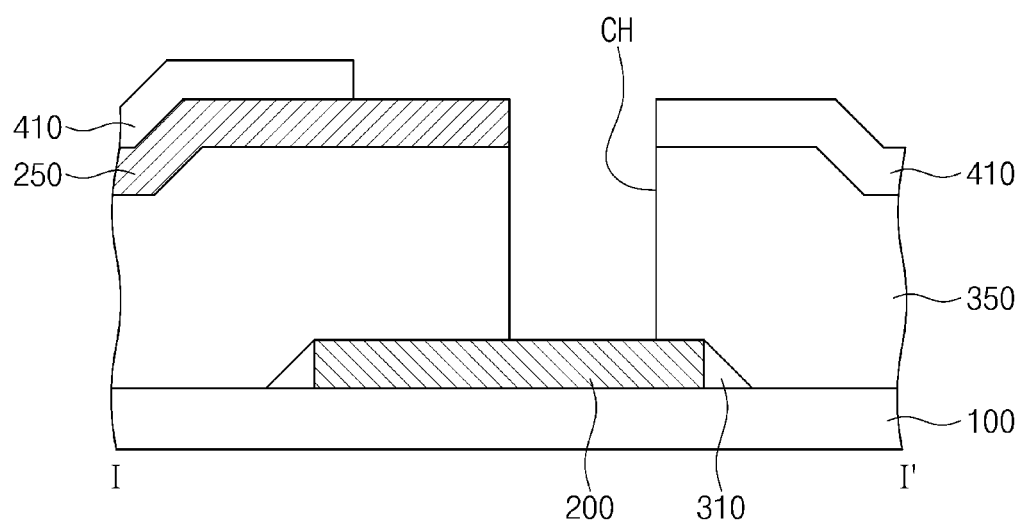

Referring to FIG. 13, a contact hole CH may be formed on the lower source/drain electrode 200. The contact hole CH may be formed to penetrate the interlayer insulating film 411, the upper source/drain electrodes 250, and the spacer layer 350. Forming the contact hole CH may include performing a photolithography process and an etching process. For example, the etching process may be a dry etching process. By the etching process, the interlayer insulating film 411 may be etched to form an interlayer insulating pattern 410. In addition, by the etching process, a portion of the upper surface of the lower source/drain electrode 200 may be exposed and a side surface of the spacer layer 350, a side surface of the upper source/drain electrode 250, and a side surface of the interlayer insulating pattern 410 may be exposed.

Although not shown in the drawing, according to some embodiments, a passivation pattern may be further formed on the contact hole CH. Forming the passivation pattern may include forming a passivation layer in the contact hole CH, and performing a dry etching process on the passivation layer. The passivation layer may include at least one of silicon oxide ($SiO_2$), silicon nitride (SiNx), and aluminum oxide ($Al_2O_3$). By the etching process, the passivation pattern may be formed to cover the inner wall of the contact hole CH and may be formed not to cover the bottom surface of the contact hole CH.

Figure 14:
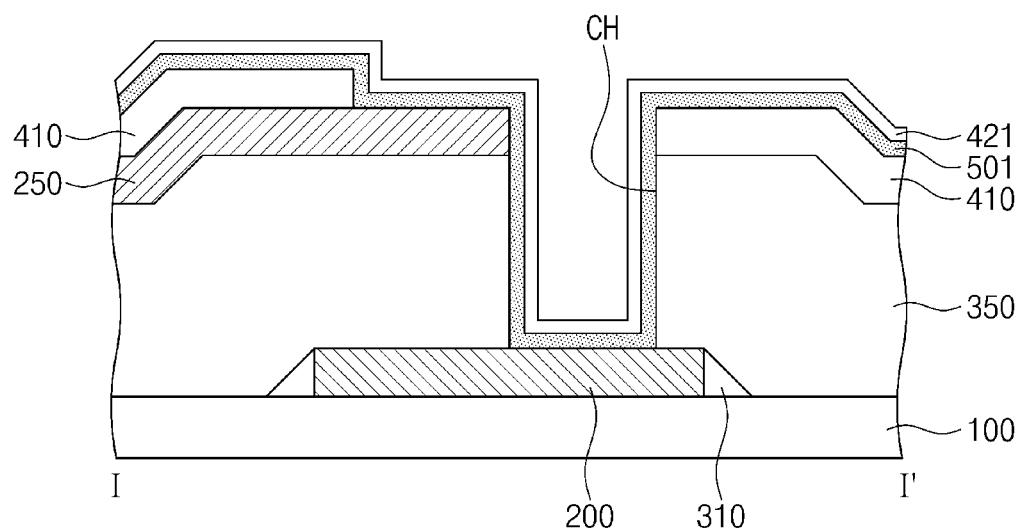

Referring to FIG. 14, the active layer 501 may be formed to conformally cover the inner wall and the bottom surface of the contact hole CH, and extend over the upper surface of the upper source/drain electrode 250 and the upper surface of the interlayer insulating pattern 410. The active layer 501 may be formed by a process such as sputtering, plasma chemical vapor deposition (PECVD), or atomic layer deposition (ALD). In some embodiments, the active layer 501 may be formed by an atomic layer deposition (ALD) process, and in this case, even if the width of the contact hole CH is reduced, excellent step coverage may be provided. The active layer 501 may include amorphous silicon (a-Si), low temperature polysilicon (LTPS), or an oxide semiconductor. For example, the oxide semiconductor may include at least one of indium gallium zinc oxide (IGZO), indium tin zinc oxide (ITZO), indium zinc oxide (IZO), indium oxide (InOx), and zinc tin oxide (ZTO). For example, the active layer 501 may be a single layer including the oxide semiconductor or a multilayer structure in which different oxide semiconductors are stacked.

A protective layer 421 may be formed on the active layer 501. The protective layer 421 may be formed to partially fill the contact hole CH. The protective layer 421 may be formed to conformally cover the upper surface of the active layer 501. Forming the protective layer 421 may be performed by an atomic layer deposition (ALD) process. The protective layer 421 may include an insulating material.

Figure 15:
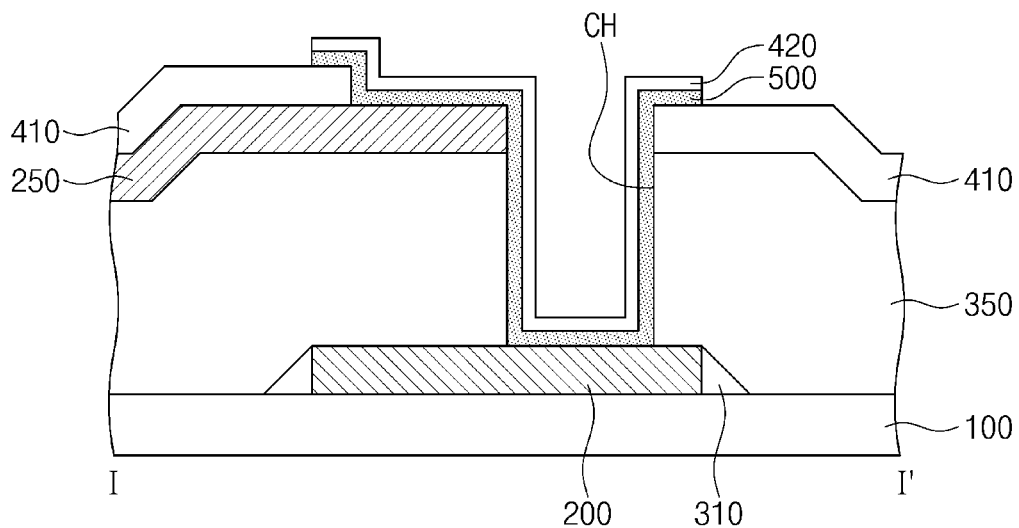

Referring to FIG. 15, an active pattern 500 and a protective pattern 420 may be formed. Forming the active pattern 500 and the protective pattern 420 may be performed by a photolithography process and an etching process. For example, the etching process may be a dry etching process. A portion of the upper surface of the interlayer insulating pattern 410 may be exposed by the etching process.

Figure 16:
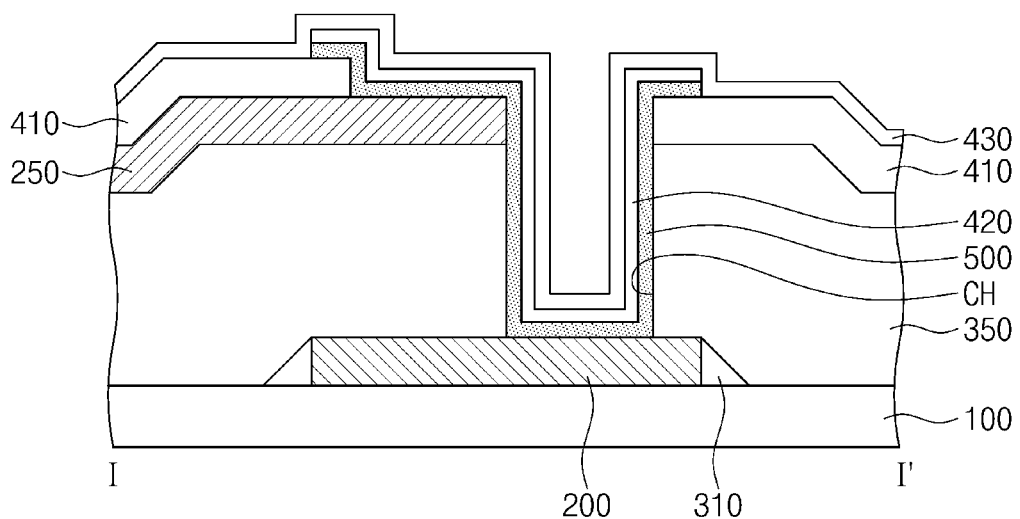

Referring to FIG. 16, a gate insulating pattern 430 may be formed on the active pattern 500 and the protective pattern 420. The gate insulating pattern 430 may be formed to partially fill the contact hole CH. The gate insulating pattern 430 may be formed to conformally cover the upper surface of the protective pattern 420 and the upper surface of the interlayer insulating pattern 410. The formation of the gate insulating pattern 430 may be performed by a plasma chemical vapor deposition (PECVD) or an atomic layer deposition (ALD) process. In relation to the process, according to conditions such as a width of the active pattern 500, a threshold voltage, a leakage current, and a drain-induced barrier lowering (DIBL), the material, deposition temperature, and thickness may be determined. Although it is not shown in this figure, a contact opening to expose upper source/drain electrode or lower source/drain electrode can be formed before the deposition of gate electrode.

Figure 17:
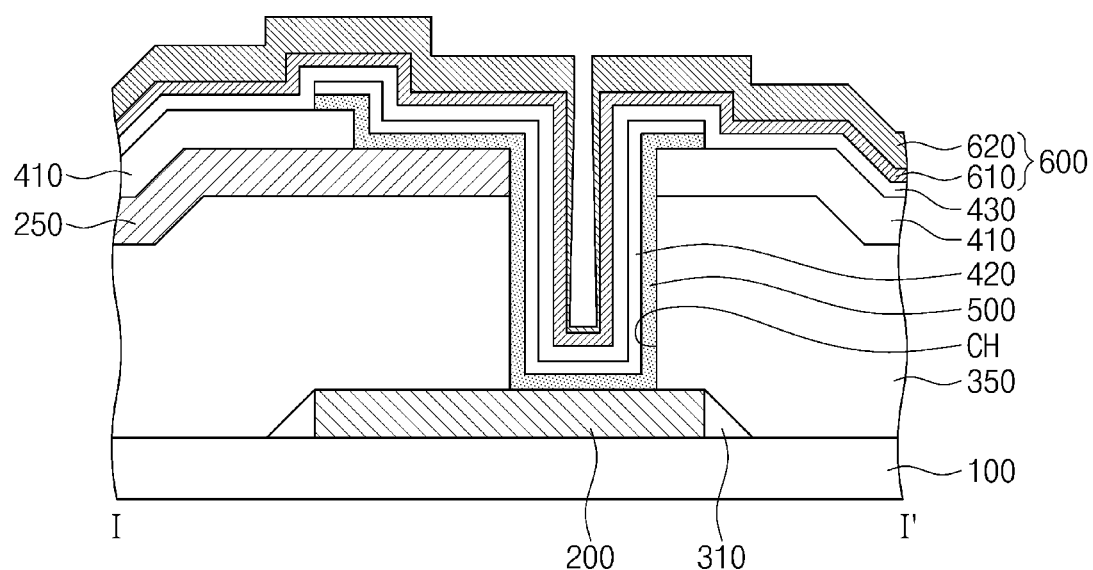

Referring to FIG. 17, a gate electrode 600 may be formed on the gate insulating pattern 430. The gate electrode 600 may be formed to partially fill the contact hole CH. The gate electrode 600 may be formed to conformally cover an upper surface of the gate insulating pattern 430.

Forming the gate electrode 600 may include forming a lower gate electrode 610 extending along an upper surface of the gate insulating pattern 430; and forming an upper gate electrode 620 extending along an upper surface of the lower gate electrode 610 on the lower gate electrode 610. The lower gate electrode 610 may be formed to conformally cover an upper surface of the gate insulating pattern 430. The upper gate electrode 620 may be formed to conformally cover an upper surface of the lower gate electrode 610. The upper gate electrode 620 and the lower gate electrode 610 may be formed by different processes. One of the upper gate electrode 620 and the lower gate electrode 610 may be formed by a sputtering process, and the other of the upper gate electrode 620 and the lower gate electrode 610 may be formed by an atomic layer deposition (ALD) process.

For example, the lower gate electrode 610 may be formed by an atomic layer deposition (ALD) process, and the upper gate electrode 620 may be formed by a sputtering process.

In this case, the lower gate electrode 610 may include indium tin oxide or indium zinc oxide having a relatively high resistance, and the upper gate electrode 620 may include molybdenum (Mo). Accordingly, the lower gate electrode 610 formed by an atomic layer deposition (ALD) process providing excellent step coverage may be formed to conformally cover the inner surface of the contact hole CH.

As another example, the lower gate electrode 610 may be formed by a sputtering process, and the upper gate electrode 620 may be formed by an atomic layer deposition (ALD) process. In this case, the lower gate electrode 610 may include molybdenum (Mo), and the upper gate electrode 620 may include indium tin oxide or indium zinc oxide having a relatively high resistance. Accordingly, the upper gate electrode 620 formed by an atomic layer deposition (ALD) process may be formed to conformally cover the inner surface of the contact hole CH.

According to the inventive concept, as the lower gate electrode 610 and the upper gate electrode 620 include different materials and are formed by different processes, the gate electrode 600 may be formed to conformally cover an inner surface of the contact hole CH. Accordingly, defects in the process of forming the gate electrode 600 may be improved.

Referring back to FIG. 2, a photolithography process and an etching process are performed on the lower gate electrode 610 and the upper gate electrode 620, so that a portion of the lower gate electrode 610 and the upper gate electrode 620 may be etched. A portion of the upper surface of the gate insulating pattern 430 may be exposed by the etching process. For example, the etching process may be a dry etching process. However, in some embodiments, when the lower gate electrode 610 is formed by an atomic layer deposition (ALD) process, the lower gate electrode 610 may be partially etched by a wet etching process. In another embodiment, when the upper gate electrode 620 is formed by an atomic layer deposition (ALD) process, the upper gate electrode 620 may be partially etched by a wet etching process.

Figure 18:
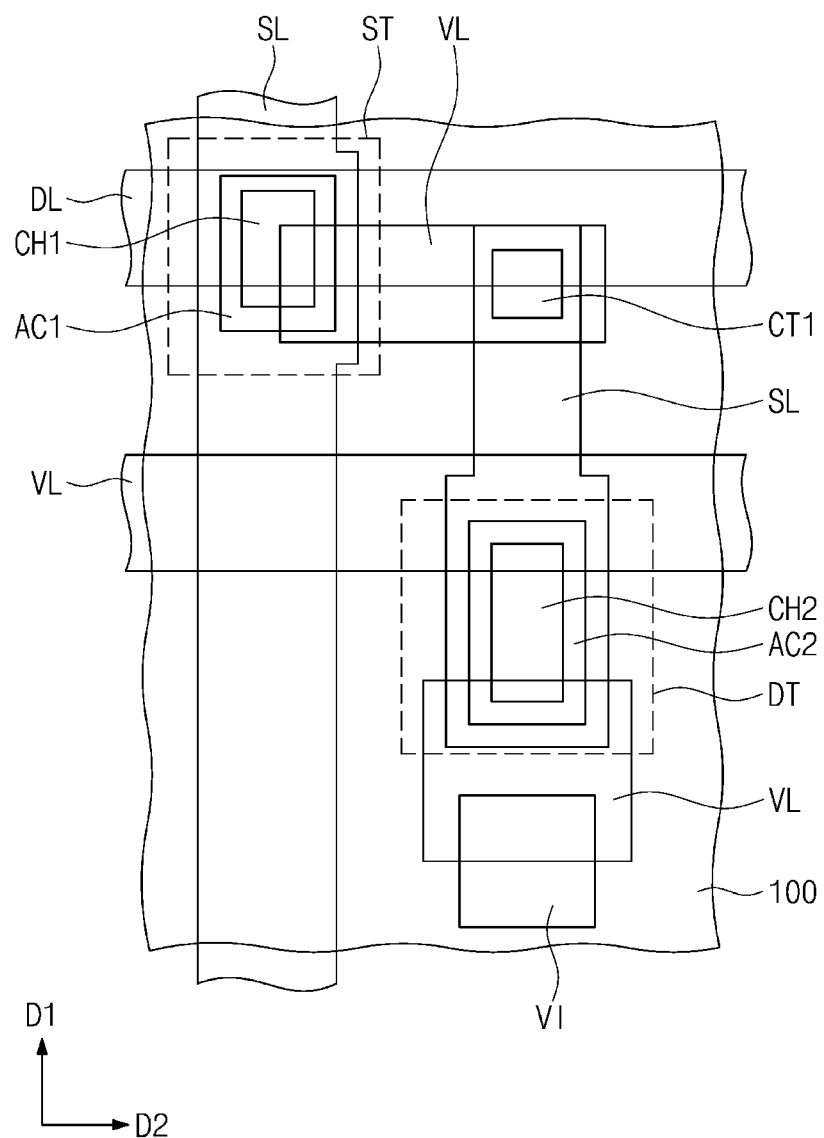
FIG. 18 is a plan view of an organic light emitting diode (OLED) backplane pixel including a vertical channel thin film transistor according to an embodiment of the inventive concept.

FIG. 18 is a plan view of an organic light emitting diode (OLED) backplane pixel including a VTFT according to an embodiment of the inventive concept.

Referring to FIG. 18, the scan lines SL may extend in the first direction D1 on the substrate 100 and may be disposed to be spaced apart from each other in the second direction D2. The scan lines SL may include a first scan line SL1 and a second scan line SL2. The data line DL may extend in the second direction D2. The first scan line SL1 and the data line DL may be disposed to cross each other. The power supply voltage lines VL may extend in the second direction D2 and may be disposed to be spaced apart from each other in the first direction D1. The power supply voltage lines VL may include a first power supply voltage line VL1, a second power supply voltage line VL2, and a third power supply voltage line VL3. For example, the scan line SL may transmit a gate signal, and the data line DL may transmit a data voltage.

A switching thin film transistor ST may be formed in a region where the data line DL and the first scan line SL1 intersect. The first power supply voltage line VL1 may be disposed adjacent to a region where the switching thin film transistor ST is formed. Specifically, the first power supply voltage line VL1 may vertically overlap a region where the data line DL and the first scan line SL1 cross each other. A first active layer AC1 may be disposed adjacent to a region where the data line DL and the first scan line SL1 cross each other. The first active layer AC1 may vertically overlap a region where the data line DL and the first scan line SL1 cross each other.

A first contact hole CH1 may be disposed adjacent to a region where the data line DL and the scan line SL cross each other. Specifically, the first contact hole CH1 may vertically overlap a region where the data line DL and the first scan line SL1 cross each other.

For example, the switching thin film transistor ST may be the VTFT of FIGS. 1 and 2. For example, a portion of the first scan line SL1 on the region where the switching thin film transistor ST is formed may correspond to the gate electrode 600 of FIGS. 1 and 2, and a portion of the data line DL may correspond to the lower source/drain electrode 200 of FIGS. 1 and 2, and a portion of the first power supply voltage line VL1 may correspond to the upper source/drain electrode 250 of FIGS. 1 and 2. The first active layer AC1 may correspond to the active pattern 500 of FIGS. 1 and 2, and the first contact hole CH1 may correspond to the contact hole CH of FIGS. 1 and 2.

A driving thin film transistor DT may be formed in a region where the second scan line SL2 and the power supply voltage line VL (for example, the second power supply voltage line VL2 or the third power supply voltage line VL3) intersect. For example, the driving thin film transistor DT may be the VTFT of FIGS. 1 and 2. As another example, the driving thin film transistor DT may be a thin film transistor including a planar channel.

A second active layer AC2 may be disposed adjacent to a region where the second scan line SL2 and the power supply voltage line VL cross each other on the region where the driving thin film transistor DT is formed. The second active layer AC2 may vertically overlap a region where the second scan line SL2 and the power supply voltage line VL cross each other. A second contact hole CH2 may be disposed adjacent to a region where the second scan line SL2 and the power supply voltage line VL cross each other. Specifically, the second contact hole CH2 may vertically overlap a region where the second scan line SL2 and the power supply voltage line VL cross each other. A first contact CT1 may be disposed on a portion of region where the first power supply voltage line VL1 and the second scan line SL2 intersect. A via VI connected to the anode electrode may vertically overlap a portion of the third power supply voltage line VL3.

Figure 19:
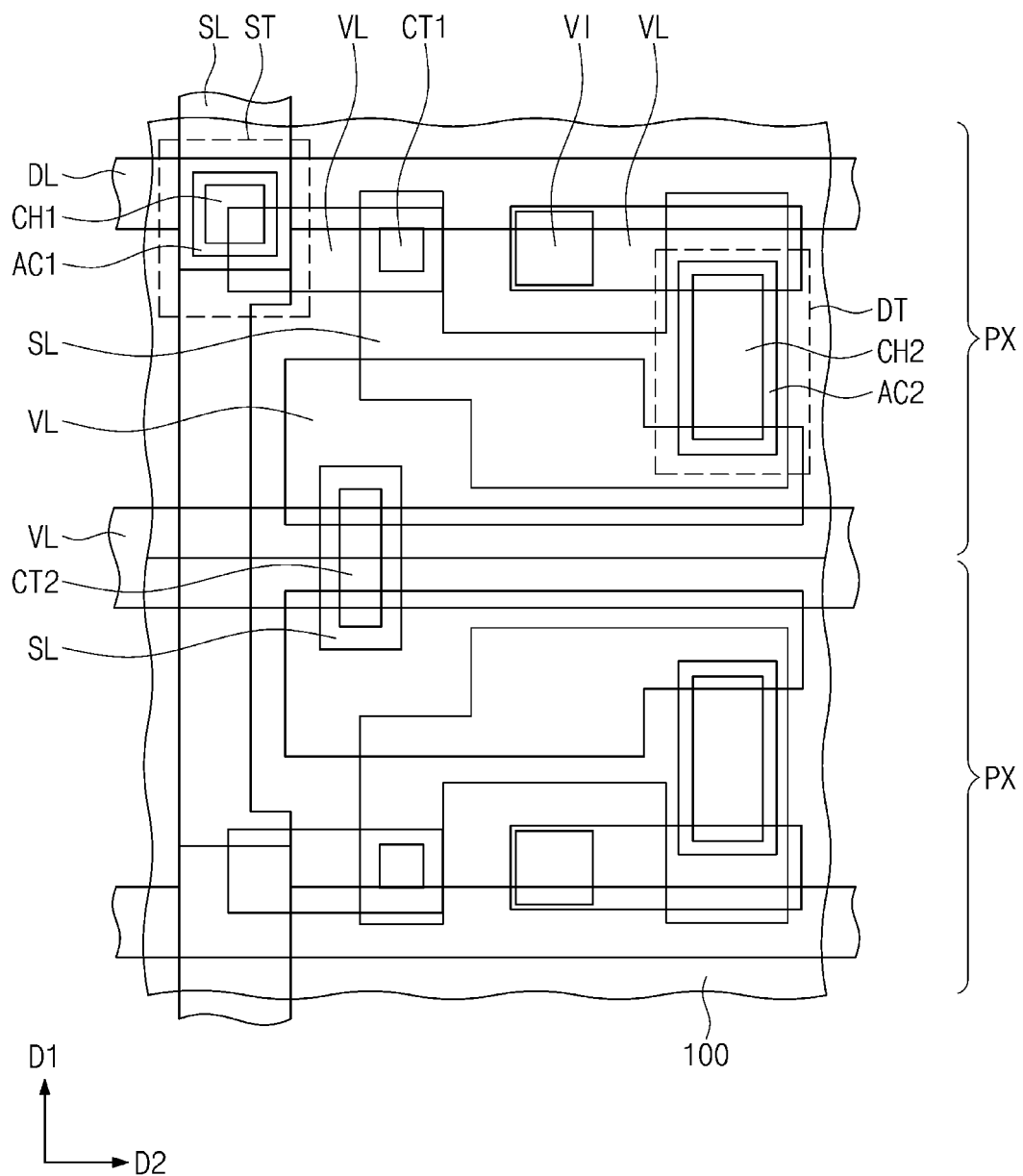
FIG. 19 is a plan view of an organic light emitting diode (OLED) backplane pixel including a vertical channel thin film transistor according to an embodiment of the inventive concept.

FIG. 19 is a plan view of an organic light emitting diode (OLED) backplane pixel including a VTFT according to an embodiment of the inventive concept. Hereinafter, content overlapping with the above content may be omitted.

Referring to FIG. 19, unit pixel areas PX may be provided on the substrate 100. Power supply voltage lines VL may include a fourth power supply voltage line VL4, a fifth power supply voltage line VL5, a sixth power supply voltage line VL6, and a seventh power supply voltage line VL7. The unit pixel areas PX may be symmetrically disposed with respect to the fourth power supply voltage line VL4.

The scan lines SL may extend in the first direction D1 on the substrate 100 and may be disposed to be spaced apart from each other in the second direction D2. The scan lines SL may include a third scan line SL3, a fourth scan line SL4, and a fifth scan line SL5. The data line DL may extend in the second direction D2. The third scan line SL3 and the data line DL may be disposed to cross each other. The power supply voltage lines VL may extend in the second direction D2 and may be disposed to be spaced apart from each other in the first direction D1.

A switching thin film transistor ST may be formed in a region where the data line DL and the third scan line SL3 intersect. The description of the switching thin film transistor ST may be substantially the same as that of the switching thin film transistor ST of FIG. 18.

The first active layer AC1 may be disposed adjacent to a region where the data line DL and the third scan line SL3 cross each other. A first contact hole CH1 may be disposed adjacent to a region where the data line DL and the third scan line SL3 cross each other. Descriptions of the first active layer AC1 and the first contact hole CH1 may be substantially the same as those of the switching thin film transistor ST of FIG. 18.

A driving thin film transistor DT may be formed in a region where the fourth scan line SL4 and the fifth power supply voltage line VL5 intersect. A description of the driving thin film transistor DT may be substantially the same as that of the driving thin film transistor DT of FIG. 18. A second active layer AC2 may be disposed adjacent to a region where the fourth scan line SL4 and the fifth power supply voltage line VL5 cross each other on the region where the driving thin film transistor DT is formed. A second contact hole CH2 may be disposed adjacent to a region where the fourth scan line SL4 and the fifth power supply voltage line VL5 cross each other. A first contact CT1 may be disposed on a portion of region where the sixth power supply voltage line VL6 and the fourth scan line SL4 intersect. A via VI connected to the anode electrode may vertically overlap a portion of the fifth power supply voltage line VL5. A second contact CT2 may be disposed between the power supply voltage line VL (for example, the fourth power supply voltage line VL4 or the seventh power supply voltage line VL7) and the fifth scan line SL5 disposed between the unit pixel areas PX. Descriptions of the second active layer AC2, the second contact hole CH2, the first contact CT1, and the via VI may be substantially the same as the description of the switching thin film transistor ST of FIG. 18.

According to the inventive concept, as the active pattern is formed on the contact hole, the width of the active pattern increases, and accordingly, the switching characteristics and current characteristics of the VTFT may be improved. Furthermore, according to the inventive concept, since the dry etching process of the active pattern and the gate electrode is performed on a flat area outside the contact hole, the occurrence of leakage current may be prevented. Furthermore, when the VTFT of the inventive concept is applied to a display, the size of a unit pixel of the display may be reduced, so that an ultra-high resolution display may be realized.

According to the inventive concept, the lower gate electrode and the upper gate electrode include different materials, and as they are formed by different processes, the gate electrode may be formed to conformally cover the inner surface of the contact hole. Accordingly, defects in the process of forming the gate electrode may be improved.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:
1. A vertical channel thin film transistor comprising:
a lower source/drain electrode on a substrate;
a spacer layer on the lower source/drain electrode;
an upper source/drain electrode disposed on the spacer layer and configured to cover a portion of an upper surface of the spacer layer;

an interlayer insulating pattern configured to cover a portion of an upper surface of the upper source/drain electrode and an upper surface of the spacer layer exposed by the upper source/drain electrode;
a contact hole disposed on the lower source/drain electrode and passing through the interlayer insulating pattern, the upper source/drain electrode, and the spacer layer;
an active pattern configured to conformally cover an inner wall and a bottom surface of the contact hole and extend over an upper surface of the upper source/drain electrode and an upper surface of the interlayer insulating pattern;
a gate insulating pattern configured to fill a portion of the contact hole and extend along an upper surface of the active pattern; and
a gate electrode configured to fill a portion of the contact hole and extend along an upper surface of the gate insulating pattern.

2. The vertical channel thin film transistor of claim 1, wherein a lower surface of the upper source/drain electrode is located at a higher level than the upper surface of the lower source/drain electrode.

3. The vertical channel thin film transistor of claim 1, wherein a portion of the upper source/drain electrode vertically overlaps a portion of the lower source/drain electrode.

4. The vertical channel thin film transistor of claim 1, wherein the contact hole exposes a portion of an upper surface of the lower source/drain electrode, a side surface of the spacer layer, a side surface of the upper source/drain electrode, and a side surface of the interlayer insulating pattern.

5. The vertical channel thin film transistor of claim 1, wherein the gate electrode comprises:
an upper gate electrode on the gate insulating pattern; and
a lower gate electrode interposed on the upper gate electrode and the gate insulating pattern.

6. The vertical channel thin film transistor of claim 5, wherein the upper gate electrode and the lower gate electrode comprise different materials.

7. The vertical channel thin film transistor of claim 5, wherein one of the upper gate electrode and the lower gate electrode is formed by a sputtering process, and the other one of the upper gate electrode and the lower gate electrode is formed by an atomic layer deposition (ALD) process.

8. The vertical channel thin film transistor of claim 1, further comprising lower side spacers provided on the substrate and disposed on both sides of the lower source/drain electrode,
wherein the lower side spacers cover both sides of the lower source/drain electrode.

9. The vertical channel thin film transistor of claim 1, further comprising a protective pattern interposed between the active pattern and the gate insulating pattern.

10. The vertical channel thin film transistor of claim 1, wherein a portion of the active pattern has a "U"-shaped cross section,
wherein a portion of the gate electrode has a "U"-shaped cross-section.

11. The vertical channel thin film transistor of claim 1, wherein the upper source/drain electrodes are vertically spaced apart from the lower source/drain electrodes.

12. A method for manufacturing a vertical channel thin film transistor, the method comprising:
forming a lower source/drain electrode on a substrate;
forming a spacer layer on the lower source/drain electrode;
forming an upper source/drain electrode to cover a portion of an upper surface of the spacer layer;
forming an interlayer insulating pattern to cover a portion of an upper surface of the upper source/drain electrode and an upper surface of the spacer layer exposed by the upper source/drain electrode;
forming a contact hole penetrating the interlayer insulating pattern, the upper source/drain electrode, and the spacer layer;
forming an active pattern that conformally covers the inner wall and the bottom surface of the contact hole and extends over the upper surface of the upper source/drain electrode and the upper surface of the interlayer insulating pattern;
forming a gate insulating pattern formed on the active pattern and filling a portion of the contact hole; and
forming a gate electrode formed on the gate insulating pattern and filling a part of the contact hole.

13. The method of claim 12, wherein the forming of the gate electrode comprises:
forming a lower gate electrode extending along an upper surface of the gate insulating pattern; and
forming an upper gate electrode extending along an upper surface of the lower gate electrode on the lower gate electrode.

14. The method of claim 13, wherein one of the upper gate electrode and the lower gate electrode is formed by a sputtering process, and the other of the upper gate electrode and the lower gate electrode is formed by an atomic layer deposition (ALD) process.

15. The method of claim 13, wherein the upper gate electrode and the lower gate electrode comprise different materials.

16. The method of claim 12, further comprising:
forming a lower side spacer film on the substrate after forming the lower source/drain electrode; and
forming lower side spacers by etching the lower side spacer film,
wherein the lower side spacers are formed to cover both sides of the lower source/drain electrode,
wherein the spacer layer covers the lower side spacers.

17. The method of claim 12, further comprising:
forming an upper side spacer film on the spacer layer after forming the upper source/drain electrodes; and
etching the upper side spacer film to form an upper side spacer,
wherein the upper side spacer is formed to cover one side of the upper source/drain electrode.

18. The method of claim 17, wherein the upper side spacer is removed by forming the contact hole.

19. The method of claim 12, further comprising forming a protective pattern on the active pattern after forming the active pattern.

20. The method of claim 12, wherein a lower surface of the upper source/drain electrode is located at a higher level than the upper surface of the lower source/drain electrode,
wherein a portion of the upper source/drain electrode vertically overlaps a portion of the lower source/drain electrode.

* * * * *